(12) United States Patent
González et al.

(10) Patent No.: US 8,193,856 B2
(45) Date of Patent: Jun. 5, 2012

(54) AMPLIFIER AND SWITCHED CAPACITOR AMPLIFIER CIRCUIT

(75) Inventors: José Manuel Garcia González, Waldkirch (DE); Norbert Greitschus, Endingen (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 73 days.

(21) Appl. No.: 12/628,748

(22) Filed: Dec. 1, 2009

(65) Prior Publication Data

US 2010/0171551 A1 Jul. 8, 2010

(30) Foreign Application Priority Data

Dec. 1, 2008 (DE) .................. 10 2008 059 734

(51) Int. Cl.
*H03F 1/36* (2006.01)
(52) U.S. Cl. ..................... 330/107; 330/51; 330/109
(58) Field of Classification Search .............. 330/51, 330/86, 107, 109, 282, 292
See application file for complete search history.

(56) References Cited

U.S. PATENT DOCUMENTS

| | | | |
|---|---|---|---|
| 3,153,202 A | 10/1964 | Woolam | |
| 4,543,534 A | 9/1985 | Temes et al. | |
| 5,825,250 A * | 10/1998 | Tomasini et al. | 330/292 |
| 5,999,042 A | 12/1999 | Hemdal et al. | |
| 6,037,836 A | 3/2000 | Yoshizawa | |
| 6,621,334 B2 | 9/2003 | Ausserlechner et al. | |
| 7,652,538 B2 * | 1/2010 | Choi | 330/292 |
| 2002/0024363 A1 | 2/2002 | Fujimoto | |
| 2002/0027453 A1 | 3/2002 | Kulhalli et al. | |
| 2002/0153946 A1 * | 10/2002 | Nguyen | 330/9 |
| 2004/0085135 A1 | 5/2004 | Jaehne et al. | |
| 2006/0091955 A1 | 5/2006 | Choi | |

FOREIGN PATENT DOCUMENTS

| | | |
|---|---|---|
| EP | 0777319 | 3/2003 |
| GB | 2167195 | 5/1986 |
| JP | 59224906 | 12/1984 |
| JP | 60128702 | 7/1985 |
| WO | 9422216 | 9/1994 |
| WO | 0201711 | 1/2002 |

OTHER PUBLICATIONS

P.E. Allen et al., "CMOS Analog Circuit Design," New York, pp. 374-386.
German Office Action.

* cited by examiner

*Primary Examiner* — Khanh Nguyen
(74) *Attorney, Agent, or Firm* — O'Shea Getz P.C.

(57) ABSTRACT

An amplifier (V) for an integrated circuit amplifier circuit (IC) having a switched capacitor circuit ($C_s$, $C_f$) includes a capacitor for frequency compensation (CC1) that is connected in parallel to an amplifier stage (V2). This amplifier is advantageous because at least one second capacitor for frequency compensation (CC2) is selectively connected in parallel to the first capacitor for frequency compensation (CC1) via a switch controlled by a capacitor switching signal (clk).

5 Claims, 4 Drawing Sheets

AMPLIFIER AND SWITCHED CAPACITOR AMPLIFIER CIRCUIT

PRIORITY INFORMATION

This patent application claims priority from German Patent Application No. 10 2008 059 734.1 filed Dec. 1, 2008, which is hereby incorporated by reference in its entirety.

BACKGROUND OF THE INVENTION

The present invention relates to an amplifier for a switched capacitor amplifier circuit.

Switched capacitor circuits are used as amplifiers in numerous applications. One example is a use in a pipeline analog/digital converter 10 as illustrated in FIG. 1A. FIG. 1A shows an amplifier configuration having an amplifier circuit. The amplifier configuration is designed with a switched capacitor Cf, Cs and is also referred to below as a switched capacitor amplifier circuit. An example of an application in reset configuration is shown here. Problems due to an offset of an amplifier V used therein may be bypassed by using this configuration, because this offset is saved in a first clock phase Φ1 of two clock phases Φ1, Φ2 and no longer appears as an error in a second clock phase Φ2.

An input voltage Vi is applied on input line i, leads to a first switch S1 and a second switch S2 connected parallel thereto. These two switches S1, S2 are triggerable for closing by a first switching signal, which is applied in a first clock phase Φ1. The second switchable capacitor Cs is connected in series between the first switch S1 and an amplifier input node n of the amplifier V. Furthermore, the first switchable capacitor Cf is connected between the second switch S2 and the amplifier input node n. A negative input of amplifier V is connected between amplifier input node n and a circuit output or amplifier output node o. An output voltage Vo is provided at the amplifier output node o. A positive input of the amplifier V is connected to a reference potential GND or to a ground terminal.

The amplifier input node n is connectable in parallel to the amplifier output node o via a third switch S3. For switching and closing the third switch S3, a first switching signal Φ1 may also be applied thereto. Furthermore, a control voltage in the form of a digital/analog converter output voltage Vdac or another reference potential, such as a reference voltage Vcm, may be applied to a node between the first switch S1 and the second switchable capacitor Cs via a fifth switch S5. A second switching signal, which is applied in second clock phase Φ2, switches and closes the fifth switch S5. A node between the second switch S2 and the first switchable capacitor Cf is switchable together with amplifier output node o via a fourth switch S4, which is also triggered to close by the second switching signal.

A control unit X, provides the first and second switching signals, among other things, in first and second clock phase Φ1, Φ2. Triggering is performed in a known manner.

During first clock phase Φ1, as shown in FIG. 2, the capacitors or their capacitances CS and CF are connected in parallel and are connected to the circuit input i via the first two switches S1 and S2 shown in FIG. 1A. The amplifier V has complete feedback via the third switch S3. The output voltage Vo, and thus the voltage at the second node of the two capacitors Cs and Cf, is reference voltage Vcm, also referred to as common mode voltage, plus offset voltage Voff of the amplifier V. The difference between the input voltage Vi and the sum of offset voltage Voff and reference voltage Vcm is stored on the parallel circuit of the first two capacitors $C_S$ and $C_F$.

During second clock phase Φ2, as shown in FIG. 3, the first two switches S1 and S2 shown in FIG. 1A are opened. The fifth switch S5 is closed and connects the second switchable capacitor Cs to reference voltage Vcm in the case of a switched capacitor amplifier circuit or a digital/analog converter output voltage Vdac in the case of a pipeline analog/digital converter. At the same time, the complete feedback loop of the amplifier V is cancelled, because the third switch S3 is opened, and the first switchable capacitor Cf is connected by the closed fourth switch S4 from amplifier input node n of amplifier V to its output node o. This yields the following value as the output voltage of the amplifier V in second clock phase Φ2:

$$Vo(\Phi 1) = Vi - (Vcm + Voff)$$

and $$V_o(\Phi 2) = \frac{Cs + Cf}{Cf} \cdot Vi(\Phi 1) = \text{Gain} \cdot Vi(\Phi 1).$$

Output voltage Vo in the second clock phase Φ2 is thus the amplified negative input voltage Vi in the first clock phase Φ1, which compensates for the offset voltage Voff. The gain=1+(Cs/Cf) of the configuration as a whole is:

$$\text{Gain} = \frac{Cf + Cs}{Cf} = 1 + \frac{Cs}{Cf}.$$

This equation is known to be accurate only when a gain A0 of the amplifier V has an infinitely large value. At a finite value of gain A0, the output voltage is wrong by the value of an amplifier error Aerr.

$$\text{Gain, real} = \frac{Cf + Cs}{Cf} \cdot \frac{1}{1 + 1/A0} = \frac{Cf + Cs}{Cf} \cdot Aerr.$$

Amplifier error Aerr becomes smaller, the greater the gain A0 of the amplifier V. To reduce the error in the gain A0, single-stage amplifier configurations, so-called OTA circuits, i.e., transconductance amplifiers or an operational amplifier having current-controlled gain, are used, for example, in the amplifier V in combination with cascode circuits. The gain A0 may be further increased by using so-called gain boosting circuits. The advantage of the single-stage configurations is that high bandwidths are achieved, because no additional measures for frequency compensation are necessary.

However, the use of cascode circuits is hardly possible in applications having low power supply voltages. In this situation, multistage amplifier configurations are used to achieve the highest possible gain A0. The reduction in the gain A0 due to the lack of cascode configuration is that additional measures must be taken for frequency compensation to ensure stable systems according to the regulating technology. FIG. 6 shows a possible two-stage gain configuration of an amplifier 600 having frequency compensation.

The amplifier 600 includes an upstream amplifier stage V1 and amplifier stage V2, having gradients gm1 and gm2, respectively, connected in series between amplifier input node n and amplifier output node o. Between the two amplifier stages V1, V2 there is a node, which is referred to below as compensation input node n2. A first amplifier capacitor C1 and the first additional resistor Ro1 are connected in parallel between reference potential GND or the ground terminal and compensation input nodes n2. Furthermore, a load capacitance CL and a second additional resistor Ro2 are connected in parallel between reference potential GND or the ground terminal and amplifier output node o.

In a practical implementation, in particular the first amplifier capacitor C1 and the first additional resistor Ro1 are already formed by component properties. The first additional resistor Ro1 is the output resistor of upstream amplifier stage V1 as the source of the real gradient gm1, the first amplifier capacitor C1 is the input capacitor of the second amplifier stage V2 with its gradient gm2 and the parasitic load capacitance of the output of upstream amplifier stage V1. There need not, but may be, an explicit placement of the first additional resistor Ro1 or the first amplifier capacitor C1. Accordingly, any parasitic elements present, if necessary, are sufficient.

A first compensation resistor RZ and a capacitor or a total capacitance for frequency compensation CC are connected in parallel to the second of the amplifier stages V2 and in series between the compensation input nodes n2 and the amplifier output nodes o.

A problem with the switched capacitor amplifier circuit 10 illustrated in FIG. 1 and the amplifier 600 illustrated in FIG. 6 is that feedback factor 13 of the amplifier 600 is different in the two clock phases $\Phi_1$ and $\Phi_2$:

$$\beta(\Phi 1) \neq \beta(\Phi 2).$$

During the first clock phase $\Phi_1$, amplifier 600 has complete feedback. The feedback factor $\beta(\Phi_1)$ is then:

$$\beta(\Phi 1)=1.$$

However, during the second clock phase $\Phi_2$, the amplifier 600 has only a smaller amount of feedback. The feedback factor $\beta(\Phi_2)$ is then less than 1 and amounts to:

$$\beta(\Phi 2) = \frac{Cf}{Cf + Cs} = \frac{1}{1 + Cs/Cf}.$$

For a classical 1.5-bit pipeline analog/digital converter, it holds that Cf=Cs, and thus feedback factor $\beta(\Phi 2)$ is equal to ½ during the second clock phase $\Phi 2$.

A frequency compensation for multi-stage amplifiers is to be designed to obtain a stable system according to regulating technology in both clock phases $\Phi 1$, $\Phi 2$. Due to the greater feedback factor $\beta(\Phi 1)$ during the first clock phase $\Phi 1$, this phase is the crucial phase for the frequency compensation.

FIG. 6 illustrates a possible frequency compensation for a second-order gain system, a so-called Miller compensation. For a feedback factor $\beta$ of $\beta=1$ and with a given load capacitance CL, a certain transit frequency $f_T$ is obtained with selected gradients $g_{m1}$ and $g_{m2}$ of the two amplifier stages V1, V2, as is known from, e.g., P. E. Allan, D. R. Holberg; CMOS Analog Circuit Design; Oxford University Press; 1987; ISBN 0-19-510720-9; page 374ff; section 8.2, etc. This transit frequency $f_T$ is equal to a gain-bandwidth product GBW of the amplifier 600, and with a feedback factor $\beta$ of $\beta=1$, it is equal to the −3 dB bandwidth of feedback amplifier V* with $f_T=f_{-3\ dB\ Gain}(\Phi 1)$ of operational amplifier OPV:

$$GBW = A0 \cdot f_{-3\ dB\ OPV}$$

$$\text{for } \beta=1 \rightarrow GBW = fT = g_{m1}/2\pi C_C.$$

$$\rightarrow f_{-3\ dB\ Gain}(\Phi 1) = f_T \beta(\Phi 1) = g_{m1}/2\pi C_C.$$

During the second clock phase $\Phi_2$, the feedback factor $\beta$ is much lower under some circumstances. In the case of a pipeline analog/digital converter stage having a gain A0=2, the feedback factor $\beta$ is only ½. However, since gain-bandwidth product GBW is constant and must be designed for the first clock phase $\Phi_1$, the resulting −3 dB bandwidth of the feedback amplifier 600 with $f_T=f_{-3\ dB\ Gain}(\Phi 2)$ is:

$$GBW = A0 \cdot f_{-3dBOPV}$$

$$\text{for } \beta = 1 \rightarrow GBW = fT = g_{m1}/2\pi C_C \rightarrow f_{-3dBGain}(\Phi 2) =$$

$$fT \cdot \beta(\Phi 2) = g_{m1}/(2 \times 2\pi C_C) = \frac{1}{2} \cdot f_{-3dBGain}(\Phi 1).$$

The bandwidth of the feedback amplifier 600 during the second clock phase $\Phi 2$ is thus only half as large as during first clock phase $\Phi 1$. This results in a longer transient recovery time, which is to be avoided only by a greater bandwidth in the first clock phase $\Phi 1$ and thus by a higher power consumption. FIG. 7 shows a frequency response of the open-loop as well as the resulting frequency response of the feedback circuit, for $\beta=1$ during the first clock phase $\Phi 1$, as well as for $\beta=½$ during the second clock phase $\Phi 2$.

There is a need for an amplifier and a switched capacitor amplifier circuit with an improved circuit design.

SUMMARY OF THE INVENTION

An amplifier for a switched capacitor amplifier circuit includes a capacitor for frequency compensation being connected in parallel to an amplifier stage, and at least one second capacitor for frequency compensation via a capacitor switching signal and/or a compensation switch being connected in parallel to this first capacitor for frequency compensation for activation or deactivation.

The amplifier is configured and arranged that the gain-bandwidth product is no longer the same during the two clock phases, i.e., GBW($\Phi$1)≠GBW($\Phi$2). A resistance is preferably understood to be an ohmic resistance. A capacitor is understood to be a component which has a capacitive effect. A switch may be understood to be any type of switch, in particular transistors or other semiconductor structures having a corresponding switch function.

The compensation switch preferably has a switch resistance greater than zero, which causes a series circuit of a resistor, in particular ohmic, to be switched to the second capacitor for frequency compensation. Therefore, the switch resistance of the switch may be used to achieve a further improvement in frequency compensation at the same time.

The switching resistor corresponds in particular to a so-called nulling resistor or a part thereof For example, a combination may also be used for the nulling resistor, including the so-called on-resistor of the switch and another, explicitly placed resistor.

A compensation resistor is preferably connected in series with the non-switched first capacitor for frequency compensation.

The compensation resistor may be formed by a switch. The compensation resistor is especially preferably designed with parameters of the compensation switch through additional switches and closed switches, such that the additional compensation switch is not switched or is not switchable. Such a dummy switch in series with a non-switched first capacitor for frequency compensation is advantageous as a "nulling resistor" to achieve an improvement in matching with the other, switched second capacitor for frequency compensation.

Amplifiers expanded in comparison with this may also be implemented. Thus, the first capacitor for frequency compensation and the at least one second capacitor for frequency compensation or the compensation switch may be connected to an input of the amplifier stage and to an output of an amplifier stage upstream therefrom and parallel to the amplifier stage, a third capacitor for frequency compensation, a fourth capacitor for frequency compensation being then connected via another capacitor switching signal and/or another compensation switch, activatable or deactivatable in parallel to this third capacitor for frequency compensation. Furthermore, a bias voltage is preferably connected between the input of the amplifier stage on the one hand, the terminal of the first capacitor for frequency compensation thereon and the terminal of the at least second capacitor or of the compensation switch thereon and between the output of the upstream amplifier stage on the other hand, the terminal of the third capacitor for frequency compensation thereon and the terminal of the fourth capacitor for frequency compensation or of the additional compensation switch thereon.

A switched capacitor amplifier circuit having at least one such amplifier is advantageous.

Preferred is an amplifier circuit in which, in a first clock phase, a first such switchable capacitor and a second such switchable capacitor are connected in parallel upstream from an amplifier input node of the amplifier, and in a second clock phase, the first switchable capacitor and the second switchable capacitor are connectable in series, and in the second clock phase, the first switchable capacitor being connected in parallel to the amplifier between the amplifier input node and an amplifier output node. This advantageously makes possible a switchable frequency compensation capacitor in switched capacitor amplifier circuits in reset configuration for independent optimization of the transient response in the two different clock phases by activating additional capacitors during the one clock phase, in particular the first clock phase, with a switch.

The compensation switch is preferably closed during the first clock phase and the first capacitor for frequency compensation is connected in parallel to the second capacitor for frequency compensation. The compensation switch is opened during the second clock phase accordingly, and the first capacitor for frequency compensation is deactivated.

Multiple such divided and switched capacitors may also be used for frequency compensation as compensation capacitors in so-called nested compensation.

In addition, a method for controlling such an amplifier and/or such an amplifier circuit is independently preferred, a capacitor switching signal being applied, with which the at least one second capacitor for frequency compensation is activated or deactivated in parallel to the first capacitor for frequency compensation.

The compensation switch is preferably closed during the first clock phase and the first capacitor for frequency compensation is connected in parallel to the second capacitor for frequency compensation. Accordingly, the compensation switch is opened during the second clock phase and the first capacitor for frequency compensation is deactivated.

A switchable frequency compensation capacitor in switch capacitor amplifiers is advantageously made possible in reset configuration for independent optimization of the transient response in the two different clock phases by activation of additional capacitors during the one clock phase, in particular during the first clock phase with a switch. These and other objects, features and advantages of the present invention will become more apparent in light of the following detailed description of preferred embodiments thereof, as illustrated in the accompanying drawings.

DETAILED DESCRIPTION OF THE INVENTION

Figure 1A:
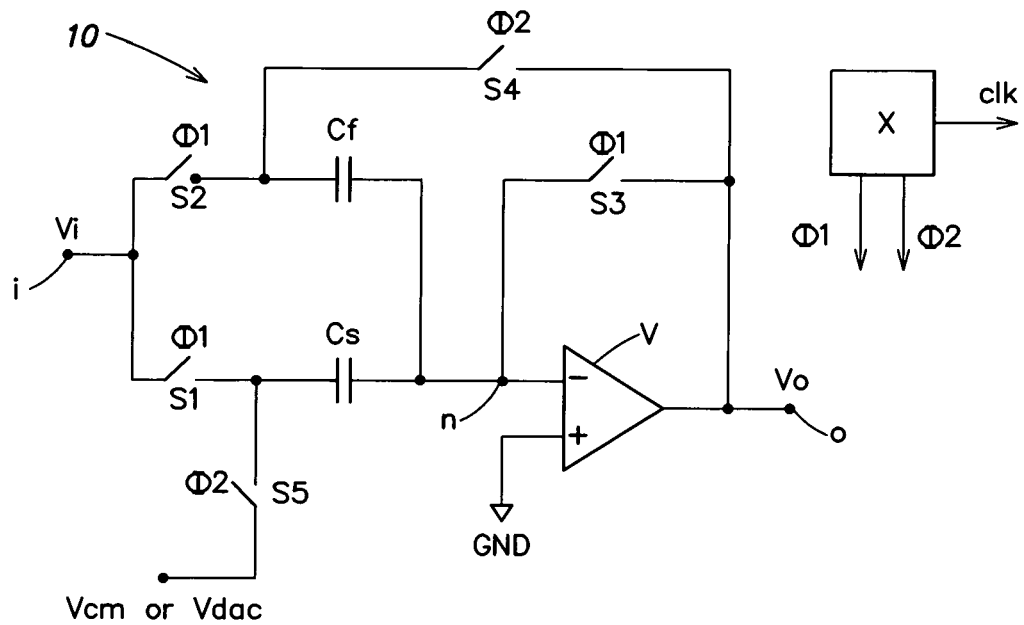
FIG. 1A illustrates circuit components of a switched capacitor amplifier circuit.
Figure 1B:
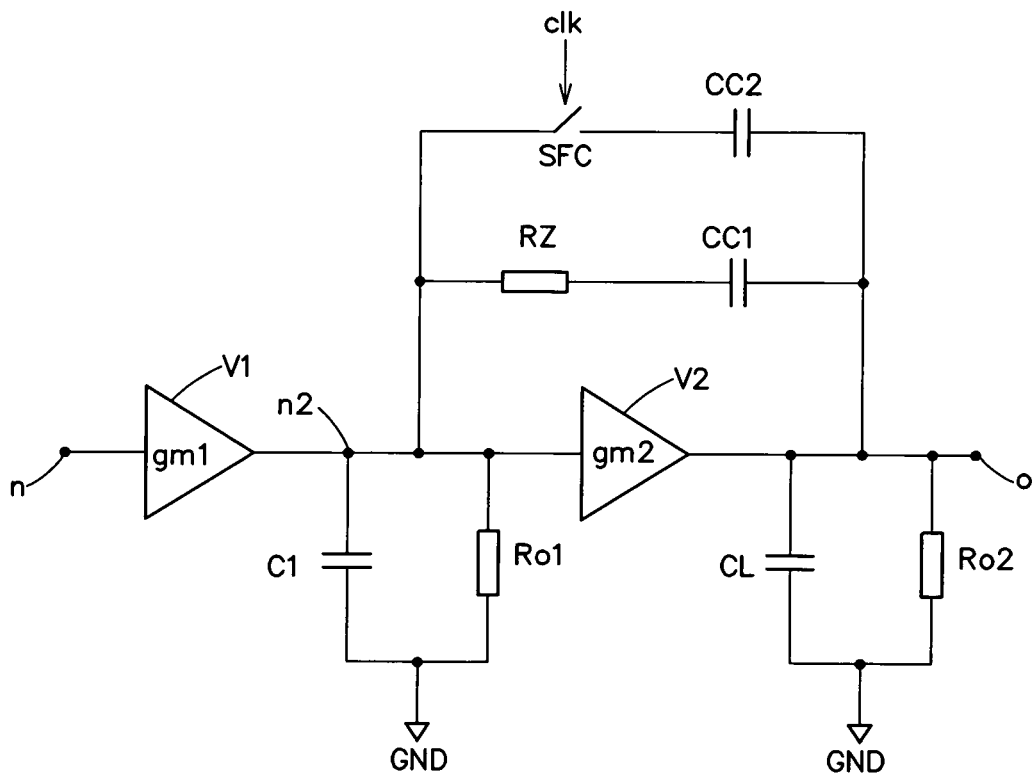
FIG. 1B illustrates a two-stage amplifier for use in the circuit of FIG. 1A according to an aspect of the present invention.
Figure 2:
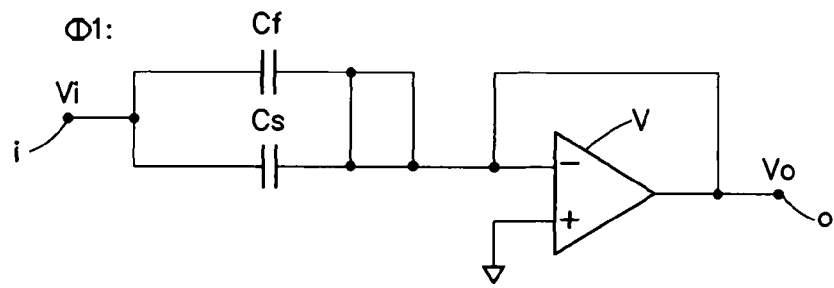
FIG. 2 illustrates an equivalent circuit of the amplifier circuit configuration in a first clock phase.
Figure 3:
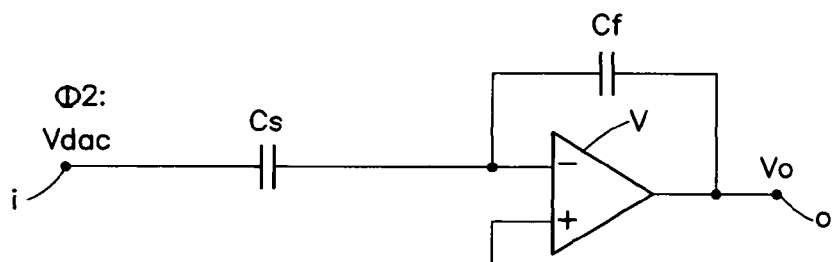
FIG. 3 illustrates an equivalent circuit of the amplifier circuit configuration in a second clock phase with switched frequency compensation.

FIG. 1B illustrates a preferred embodiment for implementing a suitable amplifier V.

An input voltage Vi is applied via an input line i to a first switch S1 and a second switch S2 in parallel thereto. These two switches S1, S2 are triggerable for closing by a first switching signal, which is applied in a first clock phase $\Phi 1$. A second switchable capacitor Cs is connected in series between the first switch S1 and an amplifier input node n of amplifier V. A first switchable capacitor Cf is connected between the second switch S2 and amplifier input node n. A negative input of the amplifier V is connected between amplifier input node n and a circuit output, i.e., amplifier output node o. Accordingly, an output voltage Vo is obtained at the amplifier output node o. A positive input of the amplifier V is connected to a reference potential GND or to a ground terminal.

The amplifier input node n is connectable to the amplifier output node o via a third switch S3 in parallel to the amplifier V. For switching and closing the third switch S3, a first switching signal $\Phi 1$ may also be applied to it. Furthermore, a control voltage in the form of a digital/analog converter output voltage Vdac, for example, may be applied to a node between the first switch S1 and the second switchable capacitor Cs via a fifth switch S5. For switching and closing the fifth switch S5, a second switching signal, which is applied in second clock phase $\Phi 2$, is used. A node is connectable to amplifier output node o between the second switch S2 and first switchable capacitor Cf via a fourth switch S4, which is also triggered to close via the second switching signal. Furthermore, the configuration has a control unit X, which provides the first and the second switching signal in the first and second clock phase Φ1, Φ2, among other things. Triggering is performed in a known manner The functioning and the design correspond basically to the description of the prior art.

An upstream amplifier stage V1 and an amplifier stage V2 having a gradient gm1 and gm2 respectively are connected in series between amplifier input node n and amplifier output node o. Between the two amplifier stages V1, V2 there is a node which is referred to below as compensation input node n2. A first amplifier capacitor C1 and a first additional resistor Ro1 are connected in parallel to one another between reference potential GND or the ground terminal and the compensation input node n2. Furthermore, a load capacitance CL and a second additional resistor Ro2 are connected in parallel between the reference potential GND or the ground terminal and the amplifier output node o.

Figure 6:
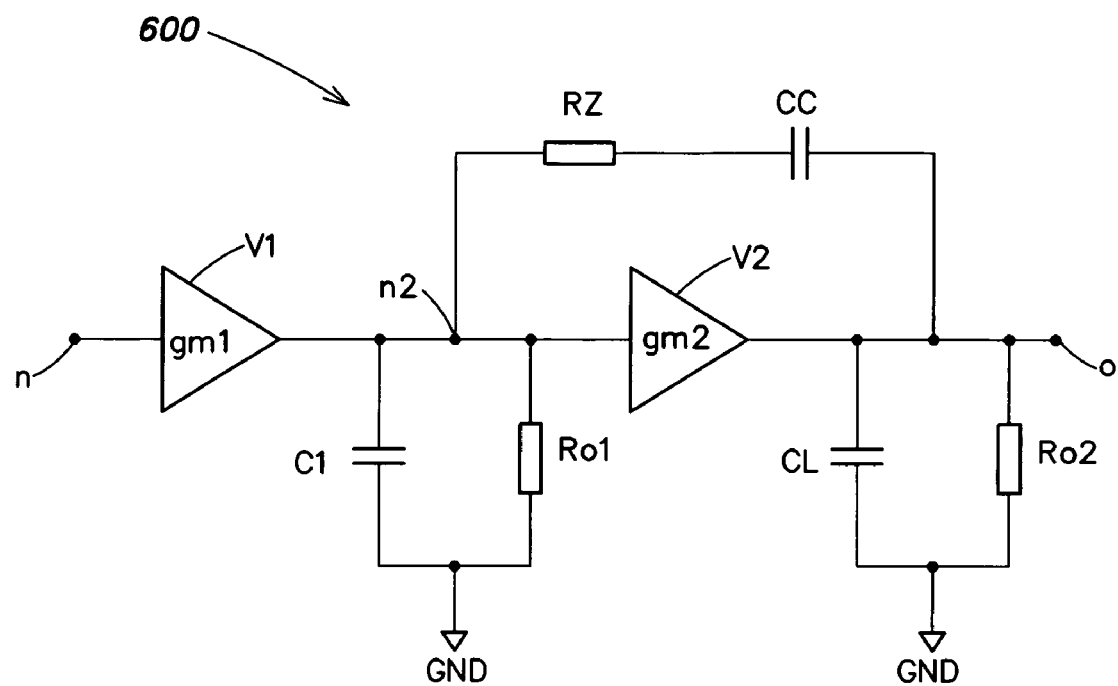
FIG. 6 illustrates a prior art 2-stage amplifier having frequency compensation.

Instead of the total capacitance for frequency compensation CC as diagramed in FIG. 6, in the preferred embodiment according to FIG. 1B, a capacitor having a lower capacitance value is used. This thus forms a first capacitor for frequency compensation CC1, which is connected in series with the first compensation resistor RZ between the compensation input node n2 and the amplifier output node o. In parallel with that, a compensation switch SFC and a second capacitor for frequency compensation CC2 are connected in series between the compensation input node n2 and the amplifier output node o. The capacitance values of the first and second capacitors for the frequency compensation CC1, CC2 are preferably selected in such a way that they have the same effect as the total capacitance, when the compensation switch SFC is closed. The compensation switch SFC is triggered to close by a capacitor switching signal clk, which is also provided by the control unit X. The capacitor switching signal clk is preferably controlled inversely to the control signal of the second clock phase Φ2 or identically to the switching signal of the first clock phase Φ1.

Another ohmic resistor may also be connected in series with the compensation switch SFC and the second capacitor for frequency compensation CC2. However, an embodiment in which the compensation switch SFC has a suitable resistance value is preferred.

According to the preferred embodiment in FIG. 1B, capacitor CC known from FIG. 6 for frequency compensation is thus divided into two capacitors, a first and a second nested capacitor for frequency compensation CC1 and CC2. During the second clock phase Φ2, the compensation switch SFC is opened and only the first nested capacitor for the frequency compensation CC1 is active for frequency compensation. This is to be set suitably for optimal transient response of the system during the second clock phase Φ2, which is in particular to be optimized, and is thus a function of the feedback factor β(Φ2) and the load capacitance CL(Φ2) during the second clock phase Φ2.

During the first clock phase Φ1, the feedback factor β(Φ1) is larger than the feedback factor β(Φ2) during the second clock phase Φ2, i.e., it holds that β(Φ1)>β(Φ2). In the case of application with a pipeline analog/digital converter, it is greater by a factor of 2. For the same transient response of the system during the first clock phase Φ1 and the second clock phase Φ2, this means that the total capacitance CC for frequency compensation is to be doubled. This is done by closing the compensation switch SFC during the first clock phase Φ1. Therefore, the second switchable capacitor CS of the higher-level surrounding circuit components is connected in parallel to the first switchable capacitor CF and the gain-bandwidth product is reduced.

The value of the first amplifier capacitor C1 is to be set independently of the value of the first switchable capacitor CF, in particular to be optimized, to take into account an influence of different load capacitances, etc., and in practice is not necessarily equal to the value of the first switchable capacitor CF of the circuit components surrounding the amplifier V. Thus a stable system in terms of regulating technology is achieved in the first clock phase Φ1 as well as in the second clock phase Φ2 without an increase in power consumption.

For amplifier structures with multiple frequency compensation, so-called nested compensation, each of the nested capacitors for frequency compensation CC1, CC2 may preferably be switched over between the two clock phases Φ1 and Φ2.

Referring still to FIG. 1B, a further improvement in frequency compensation may be achieved by using an additional zero in the transfer function of the frequency compensation network. To do so, a resistor such as compensation resistor RZ is connected in series with the compensation capacitor of the first and the second nested capacitors for frequency compensation CC1, CC2. In particular, a further improvement in frequency compensation may be achieved by using various resistor-capacitor series circuits in the two clock phases Φ1 and Φ2.

The resistor of the closed compensation switch SFC, itself used completely or partially as a series resistor or as a compensation resistor, may preferably be connected in series with the second nested capacitor for the frequency compensation CC2. If the switch SFC is itself used as a compensation resistor, it is advantageous to also replace the first compensation resistor RZ in the compensation branch, which is active only during the second clock phase Φ2, by a switch. A particularly good matching is thus achieved between the two clock phases Φ1, Φ2. Such a configuration may be used for so-called single-ended amplifier circuits as well as for fully differential amplifier circuits.

FIG. 1B shows general gradients gm1 and/or gm2. In order for the configuration in FIG. 1B to function, the gain of the second stage, namely the product of the values of gradient gm2 and of second resistor Rot itself are naturally negative. The gradient gm2 of the amplifier stage V2 is thus negative. This is correct mathematically, because the gradient gm2 is not limited to positive values.

Figure 4:
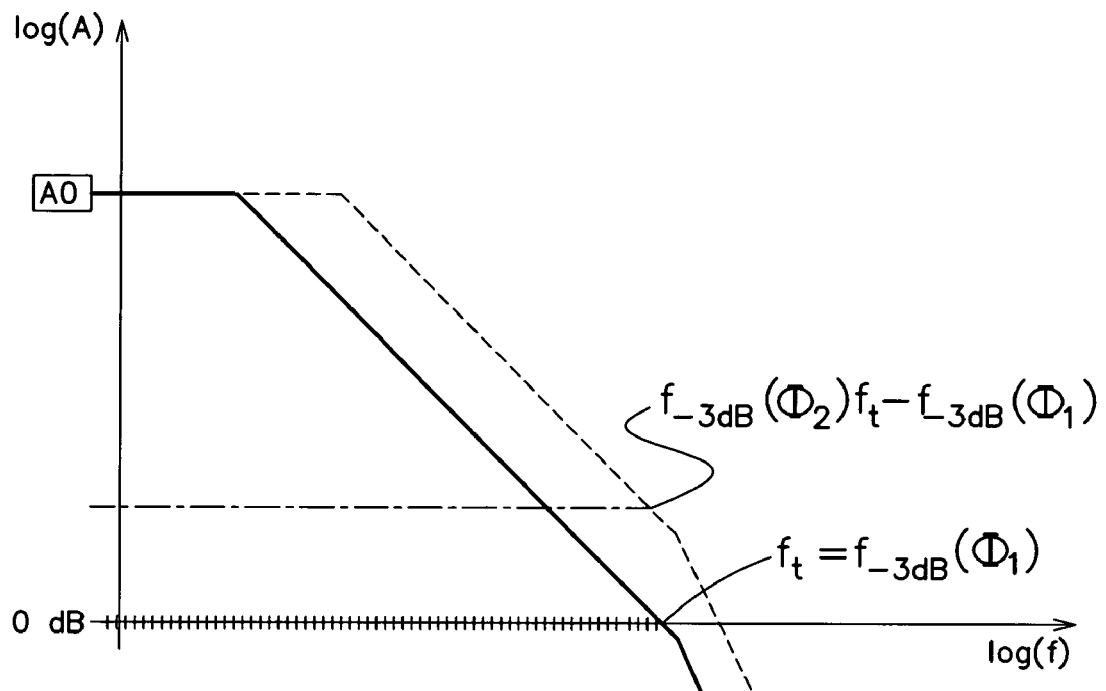
FIG. 4 shows, for the amplifier according to FIG. 1B, an open-loop frequency response for the first clock phase as a solid line and for the second clock phase as a dashed line, a closed-loop frequency response for the first clock phase as a dotted line and a closed-loop frequency response for the second clock phase as a dash-dot line.
Figure 7:
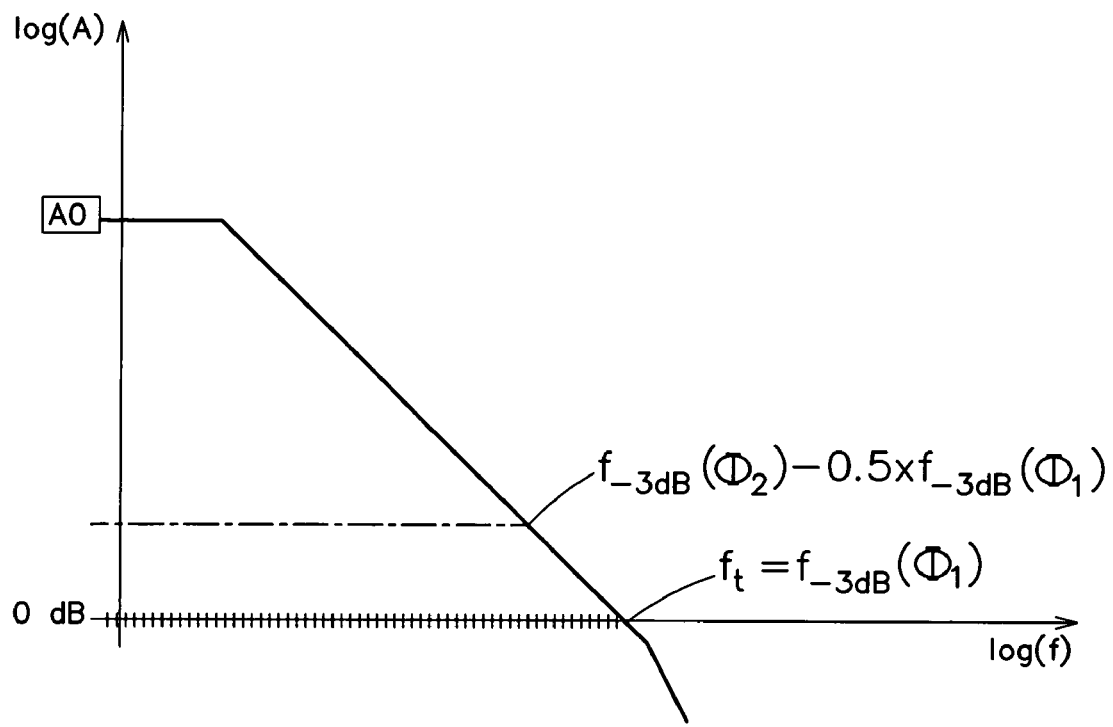
FIG. 7 shows, for the amplifier according to FIG. 6, an open-loop frequency response as a solid line, a closed-loop frequency response for the first clock phase as a dotted line and a closed-loop frequency response for the second clock phase as a dash-dot line.

FIG. 4 shows the frequency response of the open-loop gain during the first clock phase $\Phi_1$ as a solid line and the resulting frequency response of the feedback circuit for feedback factor β=1 during first clock phase $\Phi_1$, as well as the frequency response of the open-loop gain during the second clock phase $\Phi_2$ as a dotted line and the resulting frequency response of the feedback circuit for feedback factor β=½ during second clock phase $\Phi_2$. Due to an increase in the gain-bandwidth product during the second clock phase $\Phi_2$, almost the same bandwidth is achieved for feedback factor β=½ of the negative-feedback circuit during the second clock phase $\Phi_2$ as during first clock phase $\Phi_1$. A dummy switch in series with a non-switched second capacitor for frequency compensation CC2 as a "nulling resistor" is advantageous to achieve an improvement in matching with the other first switched capacitor CC1.

Figure 5:
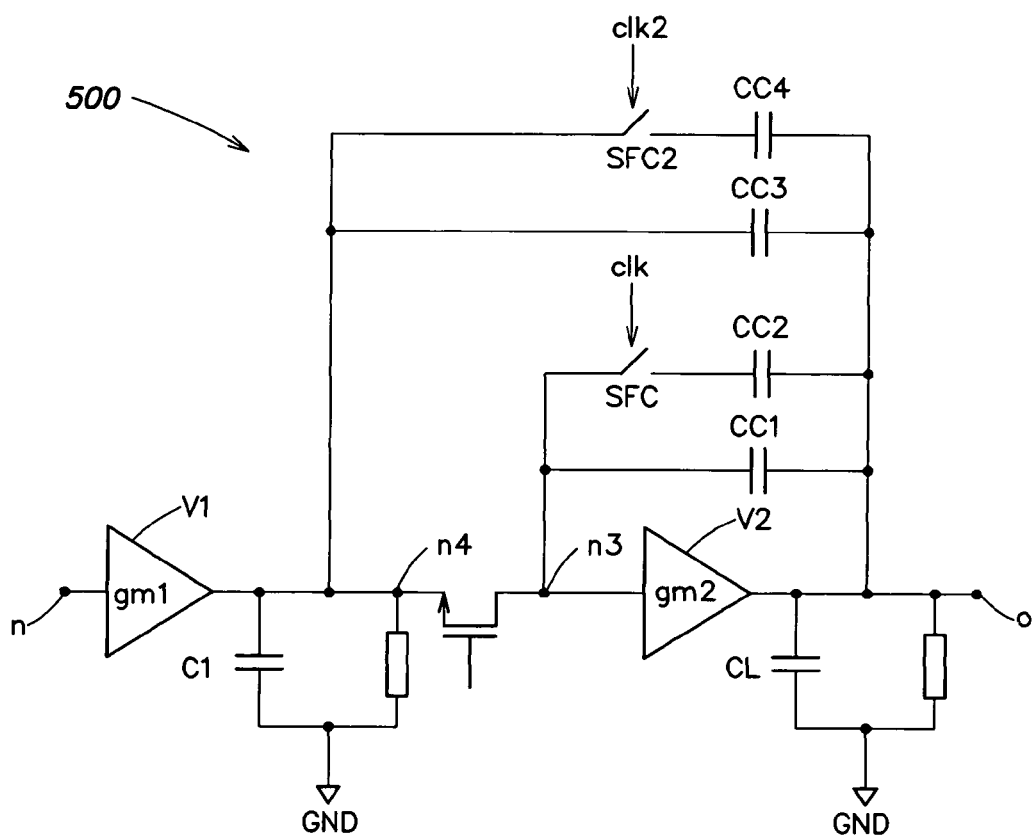
FIG. 5 illustrates an alternative embodiment of switched components of a 2-stage amplifier having frequency compensation in a switched capacitor amplifier circuit.

FIG. 5 illustrates an alternative embodiment 500 for the design of a so-called nested cascode Miller OpAmp, essentially only different features of the embodiment according to FIG. 1B being described below. The first capacitor for frequency compensation CC1 and the at least one second capacitor or that for frequency compensation CC2 or the compensation switch SFC are connected at their other end to an input n3 of the amplifier stage V2. In addition, a third capacitor for frequency compensation CC3 is connected in parallel to an output n4 of the upstream amplifier stage V1 and to the amplifier stage V2. A fourth capacitor for frequency compensation CC4 is activatable or deactivatable via another capacitor switching signal clk2 and/or another compensation switch SFC2 and is connected in parallel to this third capacitor for frequency compensation CC3 and to the output n4.

Thus essentially the third and fourth capacitors are connected in parallel to the first and second capacitors. Another stage, which works as a cascode for the first amplifier stage V1 or its gradient gm1, is connected between the input n3 of the amplifier stage V2 and the output n4 of the upstream amplifier stage V1. In the embodiment in FIG. 5, this additional stage, which works as a cascode, may be embodied as a MOSFET as an example. Of the MOSFET, its source terminal is connected to the node or to the output n4 of the upstream amplifier stage V1, whose drain terminal is connected to the node or the input n3 of the amplifier stage V2 and whose gate terminal is connected to another reference potential Vbias.

Amplifiers having one or two switchable capacitors connected in parallel are shown as examples. In the simplest case it is only one capacitor. However, other embodiments, in which some or all of the capacitors participating in frequency compensation are designed to be switchable may be implemented according to this basic principle. However, it does not matter whether all of these capacitors are in fact switched or only one is switched, which is sufficient for most applications.

FIG. 1B shows only one capacitor. If a fully differential amplifier is used, then there are two capacitors, which are switchable, in practical terms.

Although the present invention has been illustrated and described with respect to several preferred embodiments thereof, various changes, omissions and additions to the form and detail thereof, may be made therein, without departing from the spirit and scope of the invention.

What is claimed is:

1. An amplifier for an amplifier circuit having a switched capacitor circuit, comprising:
    a first capacitor for frequency compensation connected in parallel to an amplifier stage, where
    a second capacitor for frequency compensation is selectively connected in parallel to the first capacitor for frequency compensation, and is via a compensation switch,
    wherein the first capacitor for frequency compensation and the second capacitor for frequency compensation or the compensation switch is connected to an input of the amplifier stage,
    wherein a third capacitor for frequency compensation is connected in parallel to the amplifier stage at an output of an upstream amplifier stage,
    wherein a fourth capacitor for frequency compensation is switched in parallel to the third capacitor for frequency compensation and is activatable or deactivatable via a second compensation switch, and
    wherein another reference potential (Vbias) is connected between, on the one hand (i) the input of the amplifier stage, the terminal of the first capacitor for frequency compensation thereon and the terminal of the at least second capacitor or the compensation switch thereon, and, on the other hand (ii) the output of the upstream amplifier stage, the terminal of the third capacitor for frequency compensation thereon and the terminal of the fourth capacitor for frequency compensation or the second compensation switch thereon.

2. The amplifier of claim 1, wherein the compensation switch comprises a switching resistor, which, when it is switched, creates a series circuit of an ohmic resistor in particular to the second capacitor for frequency compensation.

3. The amplifier of claim 1, wherein
    in a first clock phase ($\Phi1$), a first such switchable capacitor (Cf) and a second such switchable capacitor (Cs) are connectable in parallel to one another upstream from an amplifier input node (n) of the amplifier, and
    in a second clock phase ($\Phi2$), the first switchable capacitor (Cf) and the second switchable capacitor (Cs) are connectable in series, in the second clock phase ($\Phi1$), the first switchable capacitor (Cf) being connected in parallel to the amplifier between the amplifier input nodes (n) and an amplifier output node (o).

4. The amplifier of claim 3, wherein the compensation switch
    is closed during the first clock phase ($\Phi1$) and connects the first capacitor for frequency compensation in parallel to the second capacitor for frequency compensation and
    is opened during the second clock phase ($\Phi2$) and the first capacitor for frequency compensation is deactivated.

5. The amplifier of claim 4, wherein a plurality of such nested and switched capacitors for frequency compensation are used as compensation capacitors in a so-called nested compensation.

\* \* \* \* \*